United States Patent [19]

Monnier et al.

[11] 4,380,699

[45] Apr. 19, 1983

[54] PORTABLE, IDENTIFYING ELEMENT CONSTRUCTED AS A LAMINATION OF SHEETS

[75] Inventors: Michel J. Monnier, Montgeron; Marc A. Monneraye, St Maur; Claude Foucher, Palaiseau; Pierre Le Marchant, Clamart, all of France

[73] Assignee: U.S. Philips Corporation, New York, N.Y.

[21] Appl. No.: 278,144

[22] Filed: Jun. 29, 1981

[30] Foreign Application Priority Data

Jul. 9, 1980 [FR] France ............................ 80 15303

[51] Int. Cl.³ ............................................ G06K 19/06
[52] U.S. Cl. .................................. 235/492; 235/487; 235/443
[58] Field of Search ...................... 235/492, 443, 487; 365/52, 59

[56] References Cited

U.S. PATENT DOCUMENTS 3,702,464 11/1972 Castrucci ............................ 235/492

Primary Examiner—Harold I. Pitts
Attorney, Agent, or Firm—James J. Cannon, Jr.

[57] ABSTRACT

A portable identifying element has the general shape of a laminated credit card, and comprises a front sheet (6), a central sheet (1) and a rear sheet (6'), all of plastic material. An active electronic circuit (3) is positioned within a cavity (2) of the central sheet. A thin layer of copper (7) is juxtaposed with the electronic circuit between the front sheet and rear sheet for removing heat dissipated within the circuit.

4 Claims, 5 Drawing Figures

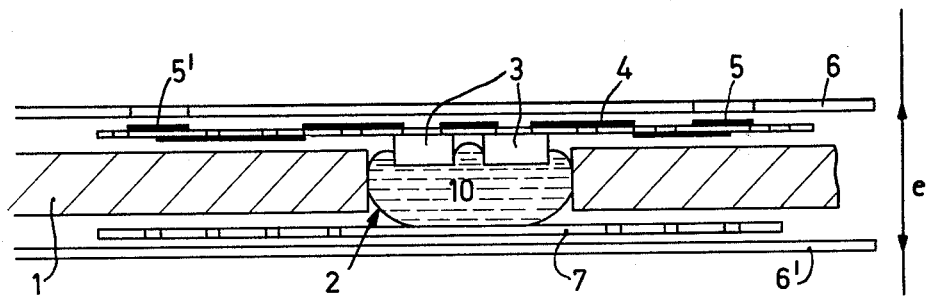
FIG.1
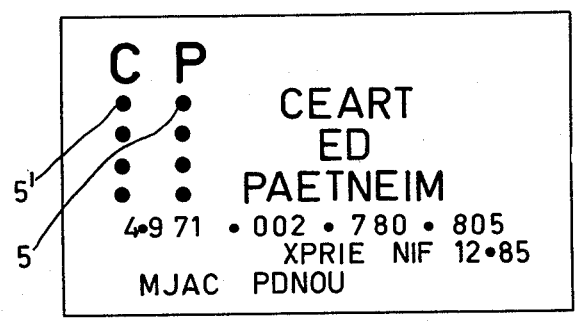
FIG.2a
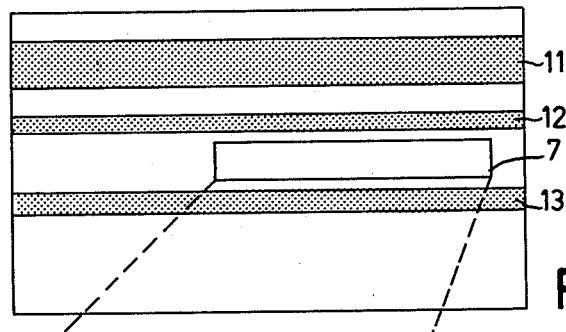
FIG.2b
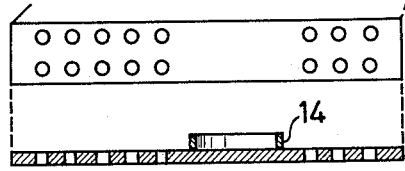
FIG.3a
FIG.3b

PORTABLE, IDENTIFYING ELEMENT CONSTRUCTED AS A LAMINATION OF SHEETS

The invention relates to a portable identifying element comprising a lamination of sheets composed of electrically insulating synthetic resin material in which is included at least one integrated solid state electronic circuit for data processing, said element being provided with external access ports for the solid state electronic circuit, said electronic circuit being supported by a carrier sheet composed of electrically insulating synthetic resin material and extending in a cavity which is provided in a main support sheet composed of electrically insulated thermoplastic material.

A portable identifying element of the above kind is known from U.S. Pat. No. 3,702,464. Such elements are capable of recording, storing and transmitting all sorts of personal or financial information, possibly protected by secret codes. Such elements would, therefore, comprise one or more memories (PROM, EPROM). One or more processing units (e.g. microprocessor) may be added. The total arrangement may communicate and cooperate with an externally powered machine or terminal device. The portable element may be powered internally (e.g. by batteries) or otherwise the external machine would provide both power and data (galvanic or contactless).

Known portable identifying elements as shown in U.S. Pat. No. 3,702,464 constitute a relatively rigid structure with a high resistance against bending. Due to the fact that the carrier sheet of the electronic circuit is laminated to the main support sheet over a relatively large area, bending of the portable identifying element causes relatively high internal stresses in the element.

SUMMARY OF THE INVENTION

It is an object of the invention to minimize the internal stresses in the carrier sheet of the electronic circuit, which stresses may be caused by bending of the laminations of sheets.

The invention is characterized in that the carrier sheet is positioned between a first cover sheet composed of electrically insulating thermoplastic material and said main support sheet, said carrier sheet being provided with holes which are located on opposite sides of said cavity and through which parts of the first cover sheet and the main support sheet are laminated together.

The established decrease of the internal stresses during bending of the element is supposed to be the consequence of only local anchoring of the carrier sheet to the first cover sheet and the main support sheet.

It is a further object of the invention to decrease the warming up of the element due to loading of the electronic circuit with data. In certain circumstances an extensive dissipation of electric energy may cause a temperature-rise in the element which leads to permanent damage.

The invention is further characterized in that the element is provided with a metal sheet which is in thermal contact with the electronic circuit and which is positioned between a second cover sheet composed of electrically insulating thermoplastic material and said main support sheet, said metal sheet being provided with holes which are located on opposite sides of said cavity and through which parts of the second cover sheet and the main support sheet are laminated together.

BRIEF DESCRIPTION OF THE FIGURES

The realization of the invention will be better understood on the basis of the following description which will be given by way of example with reference to the accompanying diagrammatic drawings.

FIG. 1 is a sectional view of the plastic card in accordance with the present invention.

FIG. 2a is a front view of the card, and

FIG. 2b is a rear view.

FIG. 3a is a top view of the thin metal sheet, and

FIG. 3b is a view in profile.

DETAILED DESCRIPTION OF THE INVENTION

FIG. 1 shows a sectional view of a portable, identifying element according to the invention, realized as a lamination of sheets. Such identifying element could be used, for example, as a credit card. Actual credit cards now issued to the general public are passive information carriers which perform only two functions:

deferred payment by mechanical transfer of a number, carried on the card in embossing 3 onto a payment sheet which is signed by the debtor in order to settle his debt.

the dispensing of banknotes by special machines, upon manual generation of a secret code which is linked to the information embodied in the magnetic tracks on the card.

A carrier of this kind has numerous inconveniences. The card may be lost or stolen, and because the identification number is visible it may be easily used for illegal payment. Regarding the dispensing of banknotes, the magnetic inscription of the secret code may be erased by a strong magnetic field or by heat, or it may be read by means of a special reader device for magnetic patterns.

Portable elements comprising one or more active electronic circuits offer, on the one hand, capabilities of realizing an enhanced security level, and on the other hand, means whereby additional functions may become feasible, such as: output of information, updating of a bank account, management of a data file, identification of a bearer (such as by voice comparison) etc.

The portable identifying element of FIG. 1 comprises a central sheet 1 of polyvinylchloride, having a customary thickness of 0.5 mm, in which there is provided a cavity 2 which serves to accommodate the electric devices 3 which may be formed by one or several semiconductor elements which are interconnected and which are supported by a thin sheet 4 of polyimide. Taken in isolation, the realization of a thin and flexible carrier of polyimide that is pierced and metallized on both surfaces has been described in an earlier French Patent Application No. 7524882 (PHF 75.567), filed Aug. 8, 1975, in the name of Applicant. The use of such carrier for realizing a relative fixation and interconnection of electronic circuits has been described in an earlier French Patent Application No. 7705769 (PHF 77.512), filed Feb. 28, 1977, in the name of Applicant.

The conductor networks on the thin sheet 4 of polyimide can thus be situated on both surfaces thereof when metallized holes provide the connection through said sheet. Furthermore, metallized contacts 5, 5' have been provided on the extremities of the network. These could be used as data terminal points, or power terminals.

Two thin sheets 6 and 6' of polyvinylchloride with a thickness of less than 0.1 mm are provided on either side of the card, thus enclosing the assembly. At the positions of the metallized contacts 5 and 5' openings are provided so that these contacts remain accessible from outside. These sheets are initially transparent and become opaque during lamination. The thickness of the ultimate card does not exceed 0.76 mm, which is the standardized value for credit cards.

On the rear of the card there is provided, in direct contact with the central sheet, a thin metal sheet 7, which serves to remove the heat developed by the electronic device during operation. This sheet 7 thus serves as a thermal radiator, so that the temperature at the level of the device can be maintained within acceptable limits.

In experiments performed by Applicant during loading of the memory of the electronic device with data, the heat dissipation approached 1 W during 50 ms. Without radiator, the temperature increased to approximately 180° C. and the card was damaged, while after the provision of the radiator the temperature did not increase beyond 60° C. Furthermore, the thin metal sheet 7 is provided with a plurality of openings. During the final stage of manufacture of the card a lamination operation is performed at a temperature beyond 100° C. and under a high pressure. The two polyvinylchloride sheets 1,6' are partially extruded into the openings and come into contact and solidify, thus very efficiently holding the sheet 7 by an anchoring phenomenon. Similarly, the thin polyimide sheet 4 may be pierced with a plurality of openings which have the same anchoring function in order to ensure fixation of this sheet in a comparatively flexible manner; this flexibility diminishes the internal stresses caused by flexing the card during the use thereof.

The thin metal sheet may be made of copper; its thickness may lie between 10 and 100 microns. Shown within cavity 2 is an amount of encapsulating resin 10. In this way the holding of the assembly is improved and the heat transfer from electronic circuit 3 to sheet 7 is enhanced. In itself the use of such encapsulating resins is standard technology. Flexing tests on the whole assembly performed by Applicant in accordance with the DIN standard (flexation of 21 mm and 20,000 tests) have demonstrated the proper holding of the assembly. It should be noted that the several sheets and further elements of the assembly have been drawn somewhat apart, in order to reach enhanced clarity. Furthermore, FIG. 1 shows only a limited fraction of the area of the portable element.

FIG. 2a is a front view of a feasible card. The contact points 5, 5' are only visible though the apertures which are provided for this purpose in the front PVC sheet. Eight contacts are shown, but the number is not restricted thereto.

FIG. 2b is a rear view of the card which illustrates the advantage of making the position of the metal sheet 7 visible with respect to the magnetic tracks which actually exist on non-electronic cards available up to now.

In this example of the positioning, the metal sheet portion is formed by a comparatively long rectangle which is situated between the two lower magnetic tracks 12 and 13. Its small thickness, amounting to a few tens of microns, enables this sheet to be integrated in the central sheet after the lamination operation, without substantially increasing the thickness thereof.

FIG. 3a is a plan view of this sheet portion 7 in the form of a rectangle in which a plurality of openings are provided in order to ensure its fixation.

FIG. 3b is a view in profile of the same sheet portion, including a protective ring 14, for example, of teflon which is positioned in line with cavity 2 in the central sheet. This ring will limit plastic flow into and/or out of this cavity during the lamination operation.

A portable element as described supra may be used for various purposes, such as electronic payment card, passport or carrier of confidential information. The sheet 7 may have various thickness values and/or shapes.

What is claimed is:

1. A portable identifying element comprising a lamination of sheets composed of electrically insulating synthetic resin material, in which is included at least one integrated solid state electronic circuit for data processing, said element being provided with external access ports for the solid state electronic circuit, said electronic circuit being supported by a carrier sheet composed of electrically insulating synthetic resin material and extending in a cavity which is provided in a main support sheet composed of electrically insulating thermoplastic material and said main support sheet, said carrier sheet being provided with holes which are located on opposite sides of said cavity and through which parts of the first cover sheet and the main support sheet are laminated together.

2. A portable element as claimed in claim 1, characterized in that the element is provided with a metal sheet which is in thermal contact with the electronic circuit and which is positioned between a second cover sheet composed of electrically insulating thermoplastic material and said main support sheet, said metal sheet being provided with holes which are located on opposite sides of said cavity and through which parts of the second cover sheet and the main support sheet are laminated together.

3. A portable element as claimed in claim 1 or 2, characterized in that the cover sheet(s) and said support sheet are composed of polyvinyl while said carrier sheet is composed of polyimide.

4. A portable element as claimed in claims 1 or 2, for use as an electronic payment card.

* * * * *